June 29, 1954 L. PODOLSKY 2,682,642

TUNABLE ARTIFICIAL TRANSMISSION LINE

Filed July 30, 1949 3 Sheets-Sheet 1

LEON PODOLSKY
INVENTOR

BY
Arthur G. Connolly
his ATTORNEY

LEON PODOLSKY
INVENTOR

BY
Arthur G. Connolly
his ATTORNEY

INVENTOR.
LEON PODOLSKY
BY
Arthur G. Connolly
HIS ATTORNEY

Patented June 29, 1954 2,682,642

UNITED STATES PATENT OFFICE 2,682,642

TUNABLE ARTIFICIAL TRANSMISSION LINE

Leon Podolsky, Pittsfield, Mass., assignor to Sprague Electric Company, North Adams, Mass., a corporation of Massachusetts Application July 30, 1949, Serial No. 107,803

4 Claims. (Cl. 333—82)

This invention relates to an artificial transmission line and more particularly concerns a high frequency tuning circuit.

In the tuning of high frequency circuits to a multiplicity of fixed channels with specific assigned frequencies, such as are used for television broadcasting, it is highly advantageous to have a tuning system which provides the same gain and selectivity at each frequency and which is easily adjustable to the desired frequency settings. In designing the usual inductance and capacitance resonant circuits with either variable inductance or variable capacitance, it is very difficult to keep the gain of the circuit and the response characteristics uniform over a wide range of adjustment, because it is necessary in such circuits to keep the inductance-capacitance ratio constant, and the variation of but a single parameter will defeat this objective.

In order to obtain the desired uniformity, for example, in television receivers, it has become the practice to make the tuning elements simulated transmission lines with multiple lumped inductances and capacitances, and to accomplish the tuning by tapping on to the line at various points, each representing one quarter of a wave of the desired frequency. In practice the simulated transmission line is constructed on the segments of a rotary selector switch with the inductors connected between the segments and the capacitors shunted between the inductors, or to the ground. In some cases the distributed capacitance between inductors is used to resonate the circuit, and the switch merely acts as a shorting bar. This method is well known and in common use, but is of great complexity and difficult of adjustment.

It is an object of this invention to produce new and improved transmission lines which overcome the foregoing and related disadvantages. A further object is to produce a novel transmission line for coupling, tuning and oscillating circuits in the high frequency ranges. Additional objects will become apparent from the following detailed description of the invention.

The foregoing objects are attained in accordance with the present invention according to which there is produced a tunable artificial transmission line comprising a U-shaped conductor, the end portions of whose legs are provided with coatings of dielectric material, and two interconnected metal sleeves, said sleeves fitting snugly about said dielectric coatings and being capable of movement along said legs in and out of registry with said coatings.

In a more restricted sense the invention is concerned with a tunable transmission line comprising a U-shaped cylindrical conductor, the end portions of whose legs are coated with inorganic dielectric layers, and two cylindrical sleeves, each of which has a length corresponding to the length of one of the dielectric layers and which fits closely thereabout, said sleeves being rigidly interconnected, and means for moving said sleeves axially along said legs in and out of registry with said layers.

In one of its preferred embodiments the invention is concerned with a tunable transmission line comprising a U-shaped cylindrical conductor, the end portions of whose legs are coated with a vitreous insulating enamel, cylindrical metal sleeves fitting closely about the enameled portions of said legs, a yoke interconnecting said sleeves, and means for moving said sleeves axially along said legs between said enameled portions and the bend of the U, thereby proportionately varying the capacitance between the sleeves and the conductor and the inductance of the conductor.

The invention is also concerned with circuits employing the novel transmission lines of the invention.

According to my invention I produce an artificial transmission line which comprises primarily a U-shaped metal conductor, generally made of a copper rod or tubing. The legs of the U-shaped conductor are provided at their end portions with dielectric layers, generally inorganic, which are ground to give a smooth surface. Slipped over the dielectric layers are two sleeves that fit snugly and intimately against the dielectric material, and which are interconnected by means of a metal yoke. This yoke is provided with means for adjusting the position of the sleeves along the legs of the U-shaped conductor. The lengths of the sleeves and of the dielectric layers are such that, while still engaged on the insulated end portions, the sleeves may be moved towards the base or bend of the U; the sleeves will then surround but not touch substantial areas of the uninsulated portions of the legs.

As the sleeves move along the dielectric layers towards the bend or base of the U, the capacity between sleeves and the enclosed conductor is reduced (air having a lower dielectric constant than solid insulating materials), and the inductance of the bent portion (base) of the U is reduced by the absorption effect of the sleeves.

By properly proportioning the diameter of the

U-shaped conductor, the length of the sleeves, the thickness and dielectric constant of the insulating material, and the insulated and uninsulated portions of the legs, it is readily possible to form a device having values of capacitance and inductance that are very useful at low and high radio frequencies, such as are used in television applications. Also, it is readily possible by correct selection of these physical parameters to keep the ratio of inductance (L) to capacitance (C) constant as the sleeve yoke is changed in position, even though the absolute magnitudes of L and C are being varied by such changes in position. Thus it becomes possible to change the resonant frequency of the device, while at the same time keeping the L to C ratio constant, and to retain uniformly all the desirable circuit performance as the resonant frequency is changed.

Reference will now be made to the appended drawings in which

Figure 1:
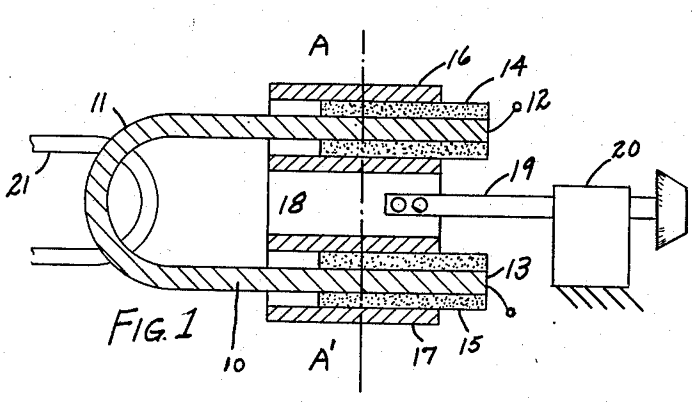
Figure 1 is a partial section of transmission line according to the invention.
Figure 3:
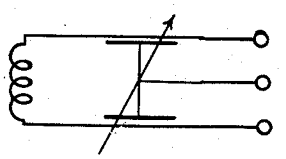
Figure 4:
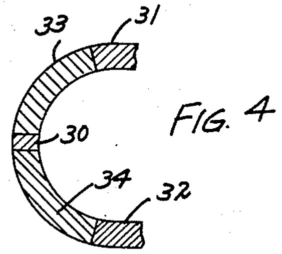
Figure 5:
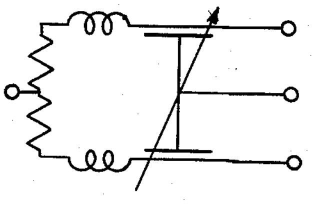
Figure 9:
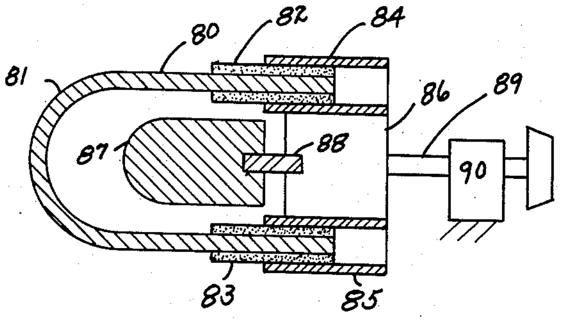
Figure 10:
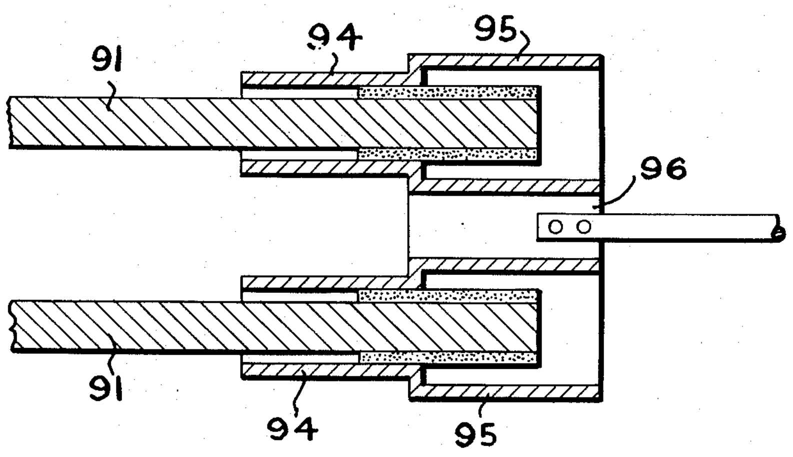

Figure 3 is a schematic electrical diagram of the transmission line of Figure 1, Figure 4 shows a modification of the base or bend of the U-shaped conductor, Figure 5 is a schematic electrical diagram of a transmission line including the U-shaped conductor of Figure 4, Figures 6, 7, and 8 show representative circuits employing the transmission lines of the invention, Figure 9 is a partial section of another form of transmission line according to the invention, and Figure 10 is a fragmentary view of a still further form of transmission line illustrative of the present invention.

Figure 2:
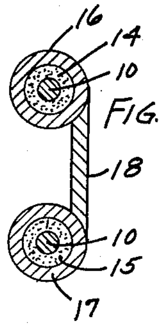
Figure 2 is a cross section along the line A—A' of Figure 1.

Referring particularly to Figures 1 and 2, 10 represents the U-shaped conductor which forms the base for the transmission lines of the invention. The primarily inductive portion of conductor 10 is located at 11 between the two legs of the conductor. A terminating point is located at the end of each leg, as indicated at 12 and 13. The end portions of the legs of conductor 10 are provided with dielectric layers 14 and 15. The length of these dielectric layers is usually about ½ the total straight length of the legs. Slide fitted closely about the dielectric layers 14 and 15 are metal sleeves 16 and 17, respectively. Sleeves 16 and 17 are rigidly interconnected by the yoke 18. Sleeves 16 and 17 may be moved axially along both legs by turning the thread element 19 through the base 20 in a conventional manner.

Figure 3 shows the schematic diagram of the transmission line of Figure 1. In it an inductor and a parallel capacitance are continuously variable. When it is desirable to couple with another circuit branch, another inductor, such as 21 in Figure 1, is brought in proximity to and within the field of the bend 11 in conductor 10.

Where broad band reception is desired, as in some television channeling arrangements, it is often desirable to include series resistance in the transmission line. In Figure 4 the base portion of the U-shaped conductor is modified by the insertion of two higher resistance portions 33 and 34 between the legs 31 and 32 and the median point 30. The portions 33 and 34 may consist of a higher resistance metal, alloy, a composition resistor, an insulator with a thin metal film thereon, or some other suitable device. Figure 5 shows the schematic electrical diagram of a transmission line of the invention employing the modified U of Figure 4.

Before discussing further modifications and the materials used in the preparation of the transmission lines of the invention, reference will be made of Figures 6, 7, and 8 which show three typical high frequency circuits employing the tuning lines of the invention.

Figure 6:
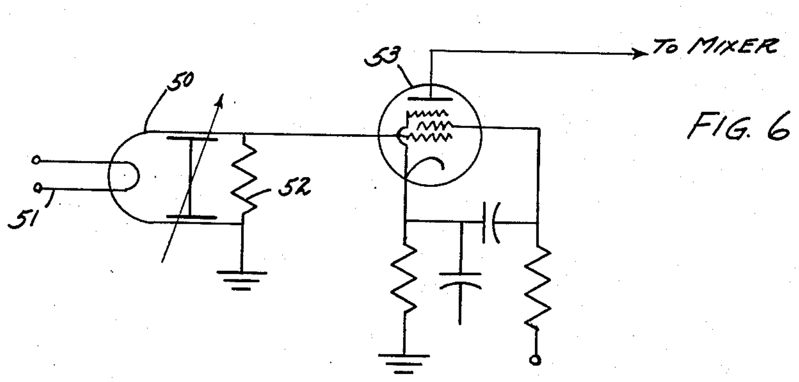

Figure 6 shows an RF amplifier stage for a television receiver. Input antenna 51 is looped in the field of the U-shaped conductor 50. A loading resistor 52 is connected across the legs of the U, and one leg of the U is grounded. The other leg is connected to the grid of the amplifier tube 53. The plate output of tube 53 goes to the mixer stage.

Figure 7:
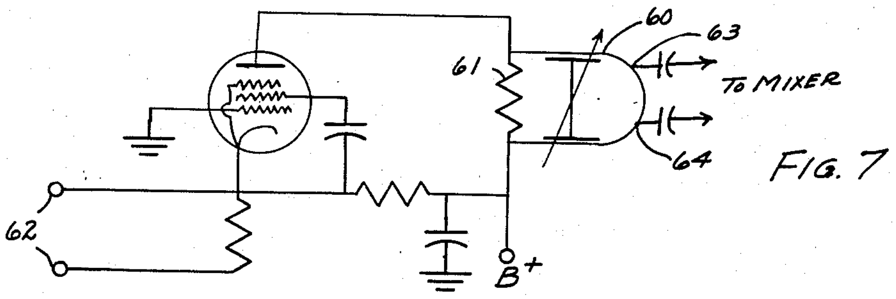

Figure 7 shows a grounded grid RF amplifier stage. In this instance the antenna is fed into terminals 62 and to the cathode of tube 65. A loading resistor 61 is inserted across the legs of the U-shaped conductor 60. Coupling condensers are tapped in the two points 63 and 64 on the bend of conductor 60 and are connected to the mixer stage.

Figure 8:
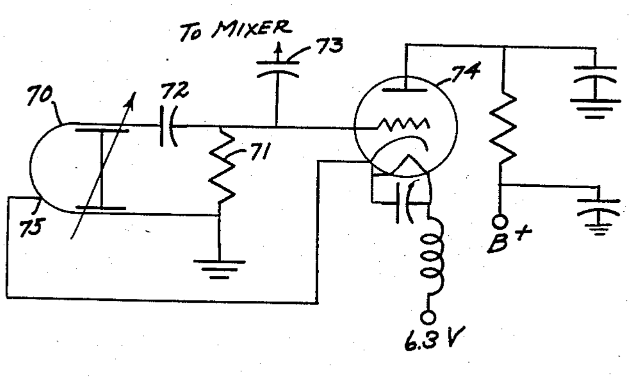

In Figure 8 a local oscillator is shown. In this case one leg of the U-shaped conductor 70 is connected through the condenser 72 to the grid of oscillator tube 74. The other leg is grounded, and the two legs are interconnected by a loading resistor 71. A tap 75 is made on the bend of conductor 70 and is connected to the cathode of the oscillator tube 74. The oscillator frequency is connected to the mixer stage through a low capacity condenser 73.

Examination of Figure 1 will show that electrical capacitance will exist between each of the legs and its cooperating sleeve due to the dielectric material that fills the space between them, and that effectively the two coaxial capacitors are connected in series through the yoke. Likewise, the U-shaped conductor forms a loop which has inductance. Sliding the metal sleeves along the legs with the connecting yoke grounded, serves to make the sleeves act as a short circuited turn about the legs, thereby substantially decreasing the inductance of the loop. It will now be seen that, when the sleeves fully register with the insulated portions of the legs, a maximum of capacitance exists in each of these sections, and also that a maximum of inductance exists in the loop, since the smallest possible part of it is shielded by the sleeves. If the yoke connecting the sleeves is moved towards the base of the U, the capacitance of the sections is gradually decreased, as there is less and less effective area with dielectric material between the legs and the sleeves, and simultaneously less inductance remains in the loop, because more of the field of the exposed portion of the U is absorbed by the sleeves.

As previously pointed out, it is thus possible to tune the line by adjusting the position of the two sleeves, while maintaining a substantially constant L to C ratio.

Referring now to the mechanical structure of the device, the U-shaped conductor 10 may be composed of a solid metal rod or alternately of a metal tube. The metal is preferably a good conductor, such as copper or silver. The dielectric layers 14 and 15 may be fused oxide films, vitreous enamel layers such as disclosed in U. S. Patent #2,290,947, electrophoretically deposited ceramic layers such as disclosed in U. S. Patent

#2,421,652, glass layers or in certain instances coatings of organic materials. The dielectric layers are generally ground in a centerless grinder or other device to form a smooth surface about which the sleeves 16 and 17 may fit snugly, while sliding along the legs.

The sleeves are made of metal and may be of copper, steel, bronze, or other such conducting metals. They are of dimensions such that they will fit closely about the dielectric layers and are preferably of the same length. Bronze is a particularly suitable metal, since its absorptive effect on the field surrounding the conductor 10 is appreciable. The interconnecting yoke 18 and its positioning device 19 may be of any suitable metal or, in the case of 19, of a non-metal.

Referring to Figure 9, a modified transmission line is shown. In this instance the conductor 80 is shaped to form a U with a bend 81, whose legs are provided with the dielectric layers 82 and 83. Sleeves 84 and 85 slide fit about the dielectric layers 82 and 83, respectively. The interconnecting metal yoke 86 is provided with adjusting means 89 and 90 as in Figure 1, but in this instance the adjustment takes place from a complete overlap of metal sleeves 84 and 85 about conductor 80 to substantially no overlap. That is, the sleeves are moved from the insulated ends of the legs outward. The yoke 86 mounts a highly permeable metal slug 87 through an insulator 88. Thus, as the sleeves 84 and 85 are returned towards the bend 81, the dielectric overlap is increased and the capacity is increased. At the same time the permeability of the fields about the conductor 80 particularly at the bend 81 is increased, and the inductance therefore becomes larger. By properly designing the elements of the assembly, it is possible to maintain a constant L to C ratio for any setting of the tunable line.

When high capacities between the conductor and the metal sleeves are desired, the insulating layers may be made of high dielectric constant material, such as titanium dioxide. Alternately, the diameter of the conductor may be large and/or the thickness of the dielectric layer small. When the inductance must be large, it is possible to introduce an extra loop in place of the simple U bend, to increase the permeability of the field surrounding the inductance, or, of course, to increase the length of the field.

In some instances, it is desirable to employ what I shall term a "stepped" sleeve in the tuning devices of the invention. The "stepped" sleeve comprises an added metal portion which is disposed at the end of the sleeve away from the bend of the U. This added portion has an inner diameter appreciably greater than that of the main sleeve portion. Thus, as the closely fitting sleeve portion is moved towards the bend of the U, the "stepped" portion, without adding appreciable capacity, does act as a shield or short circuited turn for the inductance field about the exposed, normally capacitative portion of the leg of the U. As a result, the series inductance, due to the exposed leg, is kept at a minimum.

This stepped sleeve type of construction is illustrated in Figure 10 where the principal sections of the capacitive sleeves are shown at 94, and the enlarged stepped portion shown as collars 95. Each section 94 fits around a projecting leg 91 of the U-shaped conductor, the bight of which is broken away in this figure. The two separate sleeve sections are connected together by yoke 96 for simultaneous adjustment in a manner similar to Figure 1 for example.

Various structural details of the various capacitor elements described in United States Patents 2,350,823; 2,324,178; and 2,277,968 are applicable to the tuning elements described herein.

As many different embodiments of this invention may be made without departing from the spirit and scope hereof, it is to be understood that the invention is not limited to the specific embodiments hereof except as defined in the appended claims.

I claim:

1. A tunable transmission line comprising a U-shaped conductor having extended parallel leg portions connected together by a bridging portion, coatings of dielectric material on the extended portions of said legs away from said bridging portion, the said bridging portion of said conductor having sections of a higher electrical resistance than the rest of said conductor, cylindrical conductive sleeves mounted over said dielectric coatings, a conductive yoke interconnecting said sleeves, said sleeves being positioned to reciprocate over said dielectric coatings, and control means for reciprocating said sleeves over said dielectric coatings and said leg portions of said conductor.

2. A tunable transmission line comprising a cylindrical conductor bent into generally U-shaped form having extended leg portions parallel to each other, coatings of dielectric material on each extended leg portion, a pair of cylindrical conductive sleeves each fitted over a different one of said coatings, said sleeves having a length of the order of said coatings and being interconnected together by a conductive yoke, said sleeves being reciprocable on said coatings, and enlarged cylindrical sleeve portions attached to and formed integral with each of said sleeves at the end opposite from the bend of the U, and control means connected for reciprocating said sleeves axially along said legs into and out of registry with the dielectric coatings thereon.

3. A tunable transmission line comprising a U-shaped electrical conductor having extended parallel leg portions connected together by a bridging portion, said bridging portion having sections of a higher electrical resistance than the rest of said conductor, electrically conductive sleeves fitted around the respective legs and in capacitive relation with portions thereof, an electrically conductive yoke interconnecting said sleeves, said sleeves being slidably mounted to slide to and fro with respect to the legs to change the capacitive relation of the sleeves to the legs and to also change the inductance presented by the U-shaped conductor.

4. A tunable transmission line comprising an elongated electrical conductor bent into generally U-shaped form having extended leg portions parallel to each other, a pair of electrically conductive sleeves each fitted over a different one of said legs in capacitive relation with portions of these legs, said sleeves being interconnected together by a conductive yoke and being movably mounted for movement along the legs, enlarged collars attached to and formed integral with each of said sleeves at the ends opposite from the bight of the U, and control means connected for reciprocating said sleeves axially along said legs to vary said capacitive relation and to also bring varying portions of the collars around the legs.

(References on following page)

References Cited in the file of this patent

UNITED STATES PATENTS

| Number | Name | Date |
|---|---|---|
| 1,655,784 | Garcia | Jan. 10, 1928 |
| 2,095,981 | Hansell | Oct. 19, 1937 |
| 2,117,090 | Grundmann | May 10, 1938 |
| 2,203,329 | Goldmann | June 4, 1940 |
| 2,223,985 | Davis et al. | Dec. 3, 1940 |
| 2,277,968 | Godsey | Mar. 31, 1942 |
| 2,417,290 | Brown | Mar. 11, 1947 |
| 2,427,110 | Selby | Sept. 9, 1947 |
| 2,438,784 | Landmann | Mar. 30, 1948 |
| 2,490,836 | Schriefer | Dec. 13, 1949 |
| 2,496,322 | Wallin | Feb. 7, 1950 |
| 2,557,686 | Rado | June 19, 1951 |

FOREIGN PATENTS

| Number | Country | Date |
|---|---|---|
| 109,093 | Australia | Nov. 13, 1939 |